United States Patent
Odagawa et al.

(10) Patent No.: US 6,778,427 B2
(45) Date of Patent: Aug. 17, 2004

(54) MAGNETORESISTIVE MEMORY WITH A WIRING FOR SUPPRESSING CROSSTALK

(75) Inventors: Akihiro Odagawa, Nara (JP); Masayoshi Hiramoto, Ikoma (JP); Nozomu Matsukawa, Nara (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 10/250,319

(22) PCT Filed: Dec. 26, 2001

(86) PCT No.: PCT/JP01/11443
§ 371 (c)(1),
(2), (4) Date: Jun. 26, 2003

(87) PCT Pub. No.: WO02/052650
PCT Pub. Date: Jul. 4, 2002

(65) Prior Publication Data
US 2004/0047190 A1 Mar. 11, 2004

(30) Foreign Application Priority Data
Dec. 26, 2000 (JP) .......................................... 2000-394319

(51) Int. Cl.⁷ .............................. G11C 11/14; G11C 7/02
(52) U.S. Cl. ........................ 365/158; 365/171; 365/173; 365/214

(58) Field of Search .................................. 365/158, 171, 365/173, 214, 206, 209, 66, 54, 198

(56) References Cited

U.S. PATENT DOCUMENTS

| 5,587,943 A | * 12/1996 | Torok et al. ................. 365/158 |
| 5,640,343 A | 6/1997 | Gallagher .................... 365/171 |
| 5,894,447 A | 4/1999 | Takashima .................. 365/158 |
| 6,178,112 B1 | 1/2001 | Bessho et al. .............. 365/173 |
| 6,219,275 B1 | 4/2001 | Nishimura ................... 365/173 |
| 6,413,788 B1 | * 7/2002 | Tuttle ............................ 438/3 |
| 6,522,573 B2 | 2/2003 | Saito et al. ................. 365/158 |
| 6,594,175 B2 | * 7/2003 | Torok et al. ................. 365/171 |
| 2001/0040819 A1 | 11/2001 | Hayashi et al. ............. 365/158 |

FOREIGN PATENT DOCUMENTS

JP 2002-008366 11/2002

* cited by examiner

Primary Examiner—Richard Elms
Assistant Examiner—J. H. Hur
(74) Attorney, Agent, or Firm—Merchant & Gould P.C.

(57) ABSTRACT

A magnetoresistve memory device includes a magnetoresistive element and a wiring for applying a magnetic field to the magnetoresistive element. The wiring includes two or more conductive wires that extend in the same direction. A plurality of conductive wires is used to apply a magnetic field to a single magnetoresistive element, thereby achieving high-speed response and suppressing crosstalk.

12 Claims, 14 Drawing Sheets

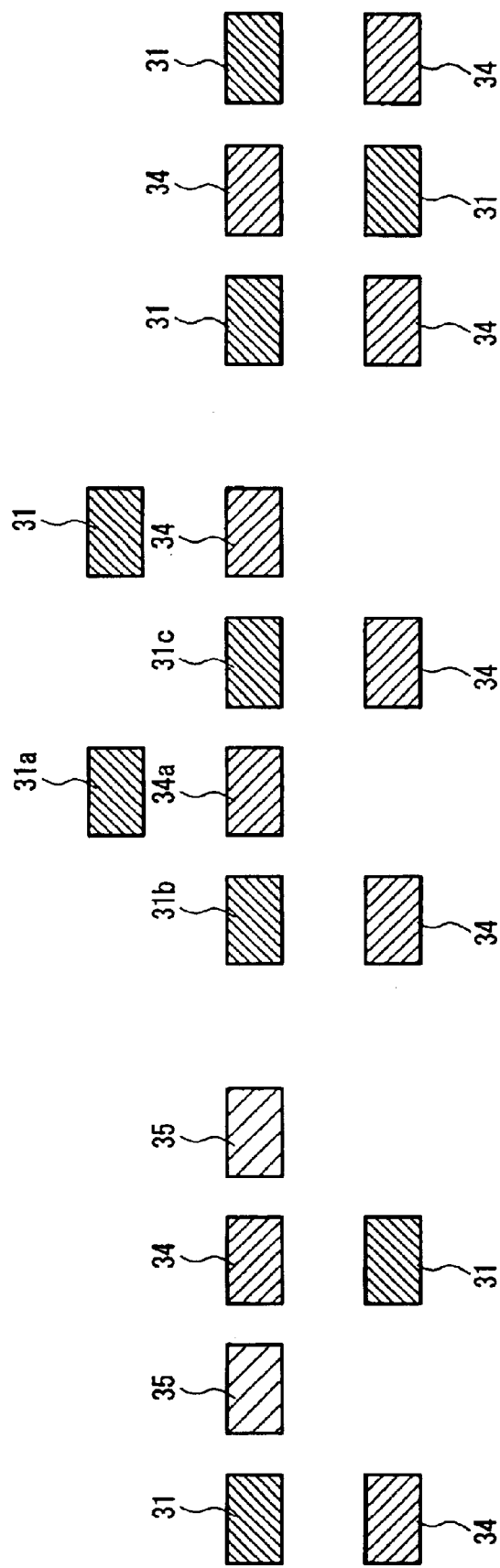

MAGNETORESISTIVE MEMORY WITH A WIRING FOR SUPPRESSING CROSSTALK

TECHNICAL FIELD

The present invention relates to a magnetoresistive memory device that utilizes a magnetoresistance effect. In particular, the present invention relates to a magnetoresistive memory device suitable for high-speed pulse transmission.

BACKGROUND ART

A magnetic random access memory (MRAM) has been studied as a solid-state memory device including magnetoresistive elements (MR elements). The MRAM is provided with a conductive wiring that includes word lines and sense lines: the word lines are used to generate a magnetic field that is applied to the MR elements for recording and the sense lines are used for reading. A conventional MRAM uses a NiFe film or the like that has an anisotropic magnetoresistance (AMR) effect, expressed by a magnetoresistance ratio (MR ratio) of about 2%. However, it is difficult to increase the output of this MRAM. Ever since an artificial lattice film, in which magnetic films are exchange-coupled via a non-magnetic film, was proved to exhibit a giant magnetoresistance (GMR) effect, a MRAM using a GMR film has been proposed. The GMR film, including antiferromagnetically exchange coupled magnetic films, has a large MR ratio. Compared with the AMR film, however, the GMR film requires a larger magnetic field, so that the current for recording/reading information is increased. In contrast to the exchange-coupling GMR film, a non-coupling GMR film is typified by a spin-valve film. The spin-valve film has various configurations, i.e., it may include an antiferromagnetic film or (semi) hard magnetic film. The spin-valve film can provide a larger MR ratio than the AMR film with a magnetic field as low as that required for the AMR film. In addition to the GMR film including, e.g., a Cu conductor film as a non-magnetic layer, a tunnel GMR (TMR) film including, e.g., an $Al_2O_3$ insulating film as a non-magnetic layer also has been used in the MRAM. The RAM that utilizes the magnetoresistance effect can form in principle a nonvolatile memory and is advantageous in achieving both high speed and high integration. Therefore, the RAM shows great promise as a next-generation memory.

The nonvolatile memory now in use is mainly a flash memory. The flash memory is voltage-driven, that is, the MOS transistor is driven with a high-speed voltage pulse during writing operation. A ferroelectric memory, which is still in the research and development stage, also is voltage-driven.

In contrast, the MRAM is a device that is current-driven. To record information on a MR element, a pulse magnetic field needs to be generated by applying a pulse current to conductive wires (word lines) that are arranged around the MR element. Therefore, when the pulse waveform is distorted, the operation of the MRAM becomes unstable. Thus, the mismatch of impedance of the word lines makes it difficult for the MRAM to operate at high speeds.

With an improvement in the degree of integration, the MRAM causes crosstalk easily. The crosstalk is magnetic field noise that is brought to the MR elements from a pulse current transmitted on the adjacent word lines. This noise interferes with an improvement in the degree of integration because it may erase the recorded information.

DISCLOSURE OF INVENTION

A word line of a single wire is used conventionally to write information into a MR element. However, there is a limit to impedance matching of the conventional word line, and crosstalk cannot be suppressed sufficiently. Therefore, the present invention employs word lines of a plurality of wires that extend in the same direction for a MR element. A magnetoresistive memory device of the present invention includes a magnetoresistive element and a wiring for applying a magnetic field to the magnetoresistive element. The wiring includes two or more conductive wires that extend in the same direction.

The present invention easily can provide the impedance matching of a pulse transmission line, thus decreasing a delay coefficient and suppressing the distortion of a pulse waveform. Therefore, a high-speed response can be achieved in a MRAM. Moreover, the present invention can make the coupling between adjacent word lines relatively weak, so that crosstalk in the MRAM can be reduced easily.

BRIEF DESCRIPTION OF DRAWINGS

FIGS. 2A and 2B show the relationship in a conventional example that uses a single wire. FIG. 2C shows the relationship in an example of the present invention.

FIG. 8A shows a conventional arrangement, in which only one signal line corresponds to a single element. FIGS. 8B to 8F each show an arrangement of the present invention, in which a signal line and at least one passive line correspond to a single element, and these conductive wires extend in the same direction.

FIGS. 9A to 9C each show another example of the arrangement of a signal line and a passive line of the present invention.

DETAILED DESCRIPTION OF THE INVENTION

Hereinafter, an embodiment of the present invention will be described with reference to the drawings.

Figure 1:
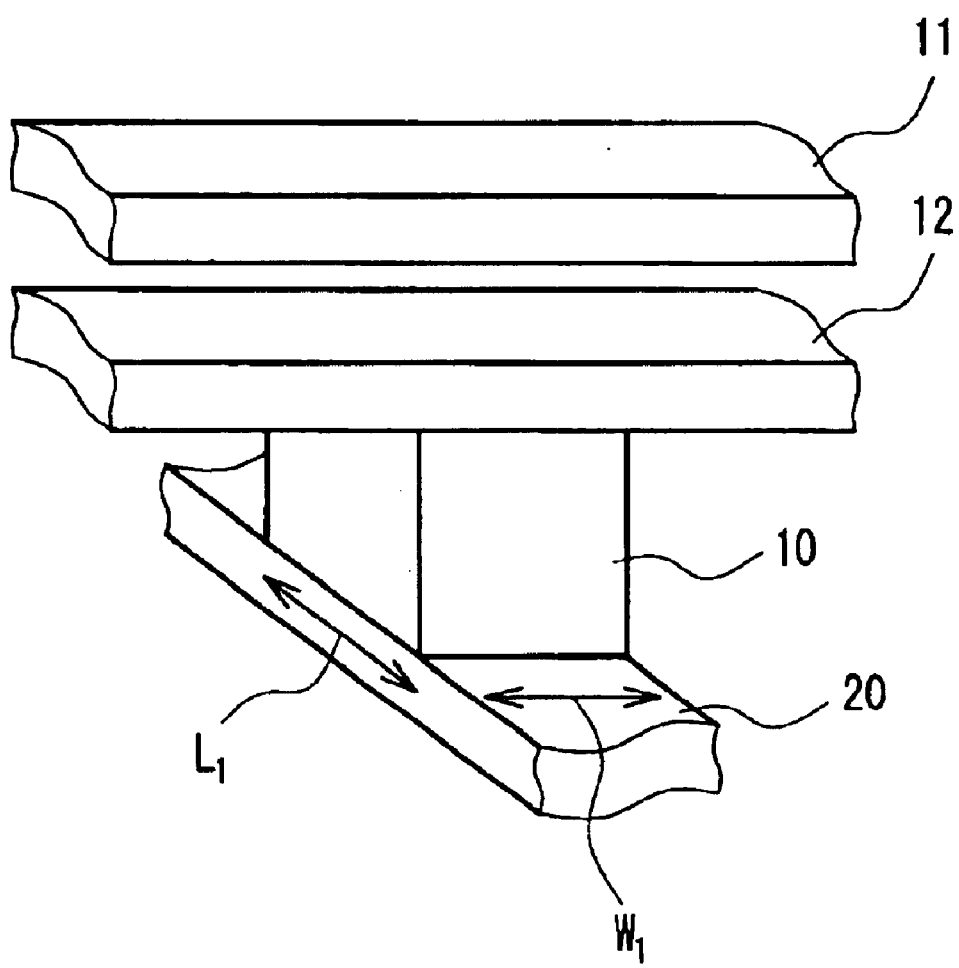
FIG. 1 is a perspective view showing an example of wiring around a MR element of the present invention.

In FIG. 1, two word lines 11, 12, i.e., two conductive wires, are arranged to write information into a magnetoresistive element (MR element) 10. A sense line 20 is arranged so as to extend perpendicular to the word lines. The word lines 11, 12 are formed of two opposing conductive films that are spaced from each other with an insulating film (not shown) therebetween. For simplification, well-known members such as an insulating film will be omitted appropriately in the following drawings.

A conventional word line consists of a single wire, and thus has a strong tendency to be coupled with other conductive wires or the like located close to each portion of the word line. This makes it difficult to achieve impedance matching. However, the use of two or more parallel conductive wires facilitates controlling the characteristic impedance of the word line.

The arrangement of the conductive wires 11, 12 is not particularly limited, as long as they extend in the same direction in a region where a pulse magnetic field is applied to the MR element for writing information. To obtain the desired characteristic impedance, it is preferable that the space between the conductive wires 11, 12 is kept within a predetermined range in that region.

Using a plurality of wires can provide low characteristic impedance that has not been achieved by a conventional single wire. The characteristic impedance of two or more conductive wires is not particularly limited, and is preferably 5 kΩ or less, more preferably in the range of about 1 Ω to 1 kΩ. The space between the conductive wires is kept preferably, e.g., within the range of 0.05 μm to 10 μm, so that the conductive wires can provide the above characteristic impedance.

To impart shape anisotropy to the magnetic film of the MR element 10, it is preferable that the element has a surface shape represented by $L_1 \neq W_1$. The shape of the MR element is not limited to a rectangular parallelepiped shown in FIG. 1, and can be various kinds of prisms, columns, truncated cones, truncated pyramids, or the like.

Figure 2:
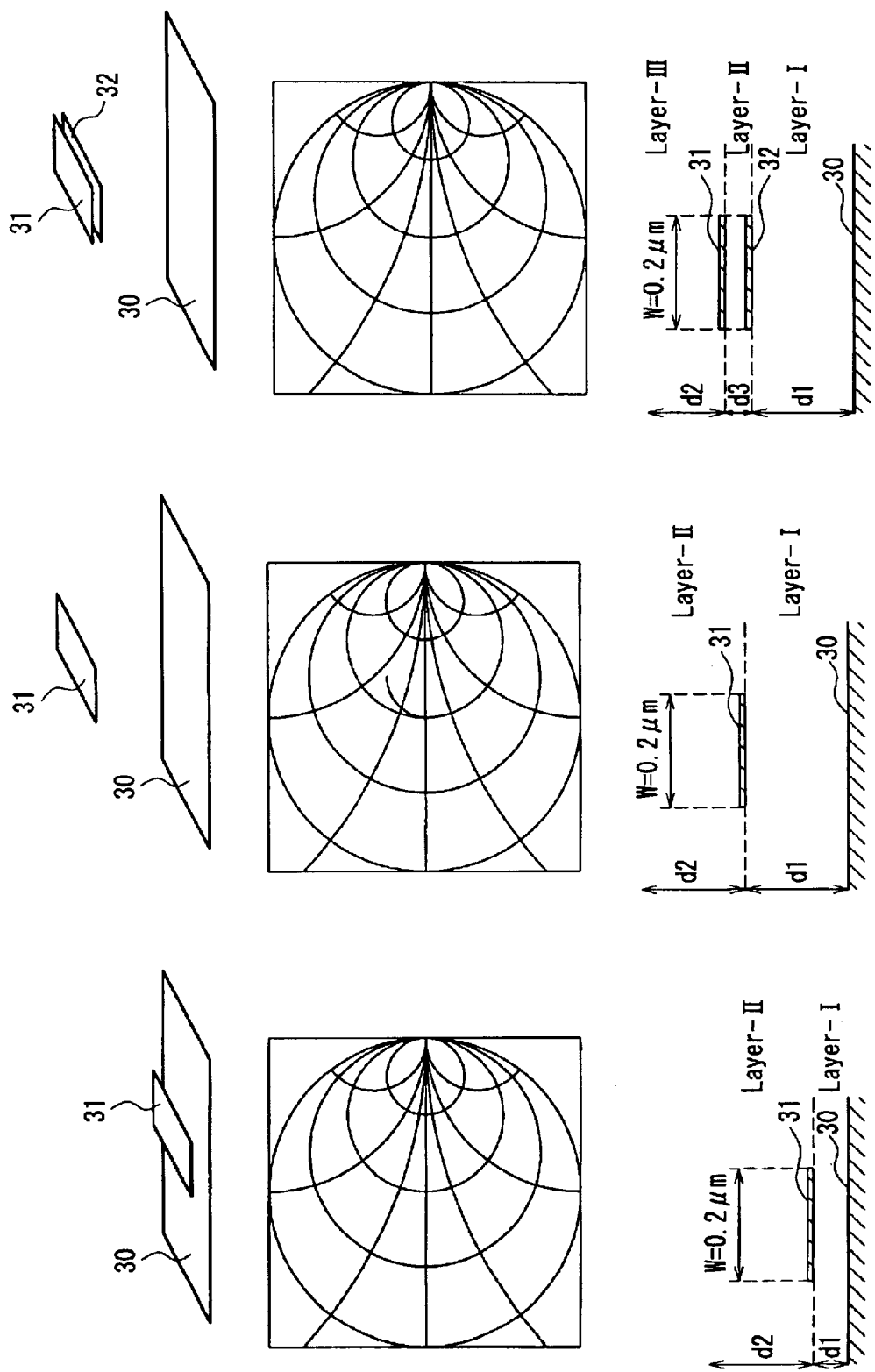
FIGS. 2A to 2C show the relationship between the arrangement of conductive wires and the dependence of the impedance of a conductive wire for transmitting pulses upon a pulse clock.

FIGS. 2A to 2C show examples of the dependence of the impedance of a transmission line for generating a pulse magnetic field upon a pulse clock. The transmission line includes a conductive wire with a width of 0.2 μm. For integration of the element, it is preferable that each of the thickness and the width of the conductive wire is 1 μm or less. Interlayer insulating films (Layer-I, Layer-II, and Layer-III) are made of aluminum oxide (having a dielectric constant of about 8.5 and a dielectric loss tangent of about 0.01). The distance d2 between an upper ground plane (not shown) and the conductive wire and the distance d1 between a lower ground plane 30 and the conductive wire are 100 μm, respectively.

When a conductive wire 31 is a single layer (FIGS. 2A and 2B), the distance d1 between the conductive wire 31 and the ground plane 30 should be reduced to about 0.2 μm to provide a characteristic impedance of 50 Ω (FIG. 2A). For a MRAM, a multi-layer film is needed to form the element and the wiring, and thus the distance d1 has to be made larger. However, when d1 is 100 μm in view of the multi-layer film, the impedance becomes considerably high (FIG. 2B).

When a plurality of conductive wires 31, 32 are used, the characteristic impedance Z can be matched to 50 Ω by keeping a distance d3 between the conductive wires of about 0.2 μm, even if the distance d1 between the conductive wire 32 and the ground plane 30 is increased to about 100 μm. It is demonstrated by the arrangement in FIG. 2C that the impedance matching can be maintained substantially, even if the frequency of a pulse current reaches about 10 GHz.

The preferred d3, i.e., the preferred distance between a pair of conductive wires that are opposite to each other, differs according to the width w of the conductive wires. In general, the range of d3 can be expressed by $w/10 \leq d3 \leq 5w$ ($w \leq 1$ μm).

When the interlayer insulator is made of silicon oxide or magnesium fluoride instead of aluminum oxide, the impedance matching also can be achieved easily by the two-layer conductive wires, though the optimum value of d3 changes slightly due to a change in dielectric constant and dielectric loss tangent.

The response to the magnetization reversal of a ferromagnetic material is measured in several hundreds of megahertz. Thus, the transmission of current pulses without causing distortion or delay is desirable for high-speed operation that takes advantage of the above property. By using a word line including a plurality of wires, waveform distortion or the like can be suppressed, even with the pulse transmission on the order of nanoseconds or less, e.g., 0.1 ns or less.

Figure 3:
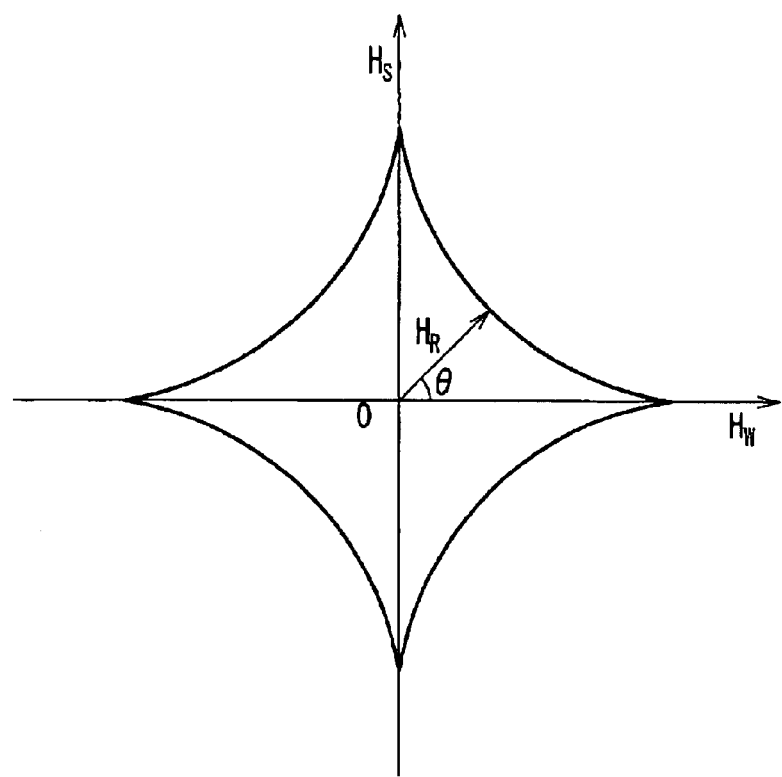
FIG. 3 shows an operating point when a synthetic magnetic field is used, the synthetic magnetic field being produced by synthesizing the magnetic field of a word line and the magnetic field of a sense line.

In writing information, a current also can flow through the sense line 20. A magnetic field $H_W$ generated by the word lines 11, 12 and a magnetic field $H_S$ generated by the sense line 20 are synthesized to produce a synthetic magnetic field $H_R$. When the synthetic magnetic field HR is applied to the MR element 10, a smaller magnetic field is required for writing. As shown in FIG. 3, the magnetic field for writing can be minimized by applying a magnetic field so that the ratio of $H_W$ to $H_S$ is 1:1 at the operating point (i.e., the angle θ between $H_W$ and $H_S$ is 45°).

Figure 4:
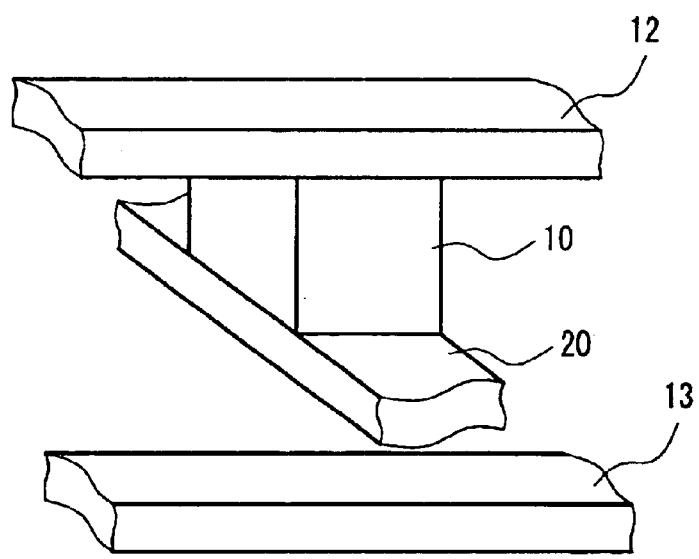
FIG. 4 is a perspective view showing another example of wiring around a MR element of the present invention.
Figure 5:
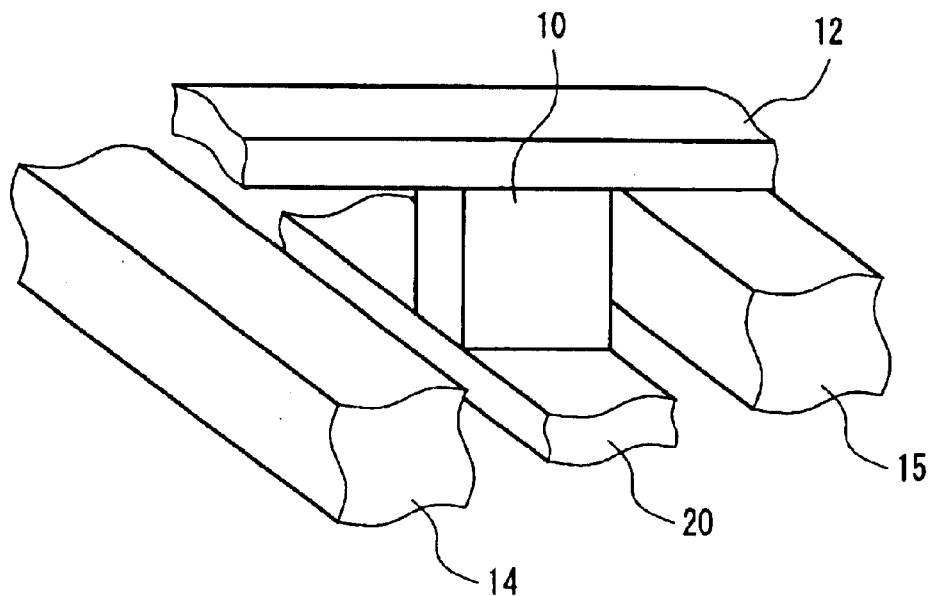
FIG. 5 is a perspective view showing yet another example of wiring around a MR element of the present invention.

The plurality of conductive wires are not limited to the arrangement shown in FIG. 1, and can be arranged, e.g., with the MR element therebetween. A pair of conductive wires that sandwich the MR element can apply $H_W$ efficiently. As shown in FIG. 4, it is preferable that the direction of sandwiching a MR element 10 between conductive wires 12, 13 is parallel to the direction in which the multi-layer film of the MRAM is stacked. As shown in FIG. 5, conductive wires 14, 15 also may sandwich an MR element 10 along the direction of the surface of the multi-layer film.

Figure 6:
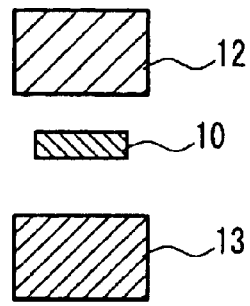
FIG. 6 is a simplified cross-sectional view of the arrangement in FIG. 4.

FIG. 6 shows only the MR element 10 and the conductive wires 12, 13 of the arrangement in FIG. 4. It is preferable that the conductive wires 12, 13 sandwiching the MR element 10 are coupled in an odd mode. When a pulse current is applied to one of the conductive wires, an antiphase pulse propagates in the other conductive wire, so that pulse magnetic fields are applied to the MR element from both of the conductive wires in the same direction.

Figure 7:
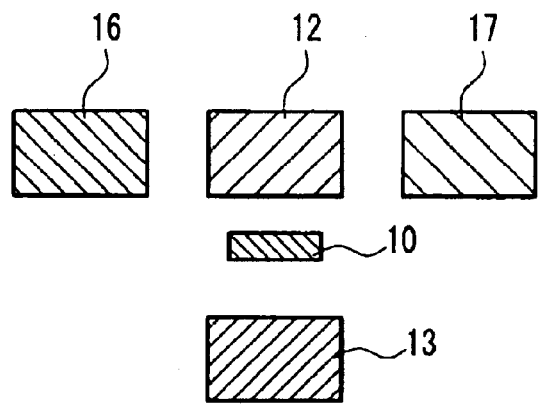
FIG. 7 is a cross-sectional view showing still another example of wiring around a MR element of the present invention.

Three or more conductive wires may extend in the same direction. For example, conductive wires 16, 17 are added in FIG. 7. In this case, the four conductive wires 12, 13, 16 and 17 can be arranged so as to provide the desired characteristic impedance as a whole.

It is preferable that the two or more conductive wires include a signal line (signal driving line) for introducing a current that applies a magnetic field and a passive line (coupling passive line) maintained at a predetermined electric potential. The electric potential of the passive line is lowered preferably to a ground potential. However, the passive line need not have the ground potential, as long as it can be maintained at a predetermined electric potential. The signal line and the passive line may be coupled capacitively so that a pulse current is generated in the passive line in response to a pulse current applied to the signal line.

FIGS. 8B to 8F each show an example of the arrangement of a signal line 31 and a passive line 32. For simplification, an MR element is not illustrated in these drawings. Here, the signal line 31 and the MR element have one-to-one correspondence, and the MR element is placed between the signal line 31 and the opposite passive line 32 (i.e., three MR elements are omitted in each of the drawings).

Figure 8A:
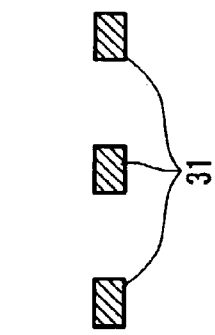
FIGS. 8A to 8F each show an example of the arrangement of conductive wires (a signal line and a passive line).

As shown in FIG. 8A, a conventional conductive wire 31 is a single wire, and thus coupled more easily to the adjacent signal lines than to a ground plane 30. This coupling causes malfunction. In contrast, as shown in FIGS. 8B to 8F, two or more conductive wires extend in the same direction for each MR element. Moreover, these conductive wires include the signal line 31 and at least one passive line 32 or 33 that is located closer to the signal line 31 than to the ground plane 30. The arrangements shown in the drawings are effective particularly in achieving high-speed pulse transmission and in suppressing crosstalk.

In each of the arrangements of FIGS. 8B to 8F, the passive line 32 is opposite to the signal line 31 via the MR element (not shown), while the passive line 33 is located on the signal line side with respect to the MR element and sandwiched between the signal lines 31, 31. The passive lines 33 have the effect of suppressing crosstalk further. That is, a preferred configuration includes a first MR element, a second MR element, and a first signal line and a second signal line for introducing a current that applies a pulse magnetic field to the first MR element and the second MR element, respectively. When the first and the second signal line extend in the same direction, at least one passive line having a predetermined electric potential may be provided between the first and the second signal line. The passive line 33 may be arranged preferably in the same plane as that including the adjacent signal lines 31, 31 (i.e., the first and the second signal line). More precisely, "the same plane" indicates that the passive lines 33 and the adjacent signal lines 31, 31 are placed on the surface of the same film of the multi-layer film in the MRAM.

As described above, it is preferable that the passive line 32 and the signal line 31 are coupled in an odd mode. In contrast, to suppress crosstalk more effectively, the passive line 33 may be coupled to at least one of the adjacent signal lines 31, 31 (preferably, both of them) in an even mode.

When the passive line 33 is identified as a first passive line, the passive line 32 is identified as a second passive line. The second passive line is arranged so that the MR element is sandwiched between the second passive line and either of the signal lines 31, 31 adjacent to the first passive line preferably in the direction in which the multi-layer film is stacked.

Figure 8B:
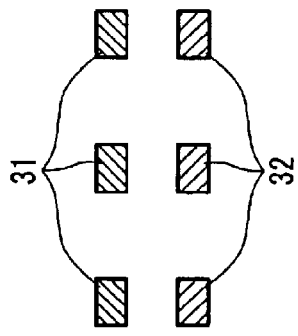
Figure 8C:
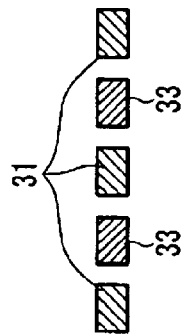

In FIG. 8B, the signal line 31 and the passive line 32 can apply a pulse magnetic field effectively to the MR element placed therebetween. In FIG. 8C, the passive line 33 between the adjacent signal lines 31 can suppress crosstalk effectively, though this arrangement is inferior to FIG. 8B in increasing the degree of integration. Each of the arrangements in FIGS. 8D to 8F has both the advantages as described above. Moreover, a leakage magnetic field is reduced in FIG. 8E, where the width of the passive line 32 is larger than that of the signal line 31, and also in FIG. 8F, where a plurality of passive lines 33 are placed between the adjacent signal lines.

The arrangement of the signal line and the passive line is not limited to the above examples. As shown in FIGS. 9A to 9C, e.g., signal lines 31 are not necessarily formed in the same plane, and can be arranged in two or more planes so that passive line 34, 35 is placed between the signal lines in either of the planes. This makes it possible to suppress crosstalk while increasing the degree of integration.

In FIG. 9B, e.g., a passive line 34a can perform the following two functions at the same time: applying a pulse magnetic field to an MR element (not shown) that is sandwiched between the passive line 34a and the opposite signal line 31a; and suppressing a leakage magnetic field from the adjacent signal lines 31b, 31c. In this manner, the passive line may be opposite to the signal line with the MR element therebetween and adjacent to other, signal lines in the same plane. As with the example described above, it is preferable that an odd mode is used for coupling the passive line 34a to the signal line 31a, and an even mode is used for coupling the passive line 34a to the signal lines 31b, 31c that are placed in the same plane.

Figure 10:
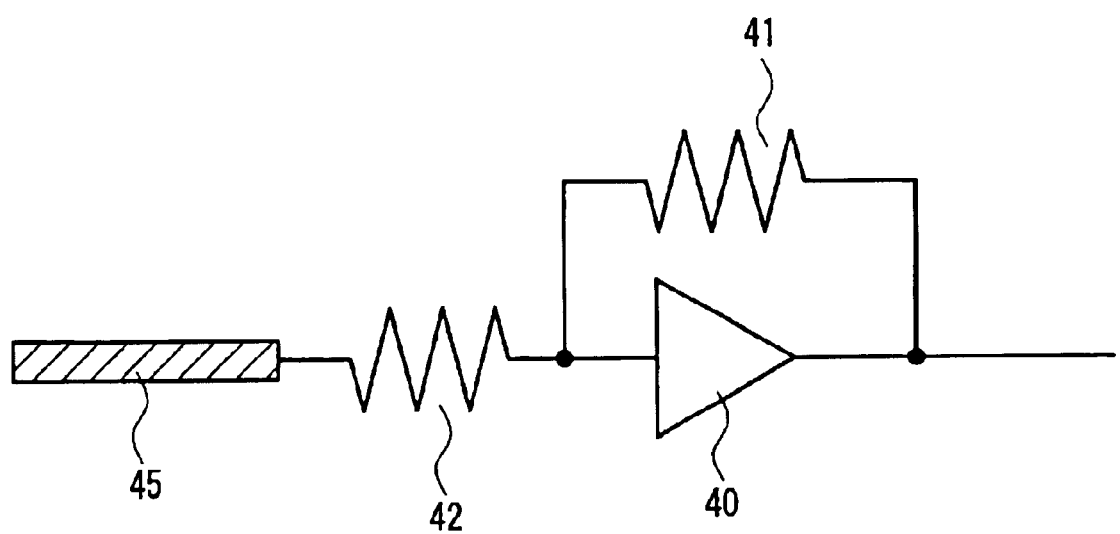
FIG. 10 shows an example of the arrangement of terminal resistance.

The odd mode or even mode coupling can be achieved by adjusting a distance between the conductive wires and terminal resistance. Though the mismatch of impedance occurs easily with an increase in the driving capacity of an input driver, this mismatch can be removed by the addition of terminal resistance. As shown in FIG. 10, the terminal resistance is formed preferably as a latch that includes a resistance 41 connected in parallel with a driver 40 and a resistance 42 connected in series between the driver 40 and a word line 45. In this case, the terminal resistance can be expressed by the sum of the two resistances 41, 42. The value of the terminal resistance may be adjusted appropriately, and in general a preferred value is about $Z^2/R$ (e.g., in the range of ±10% of $Z^2/R$), where Z represents the characteristic impedance and R represents the driver resistance.

Figure 11:
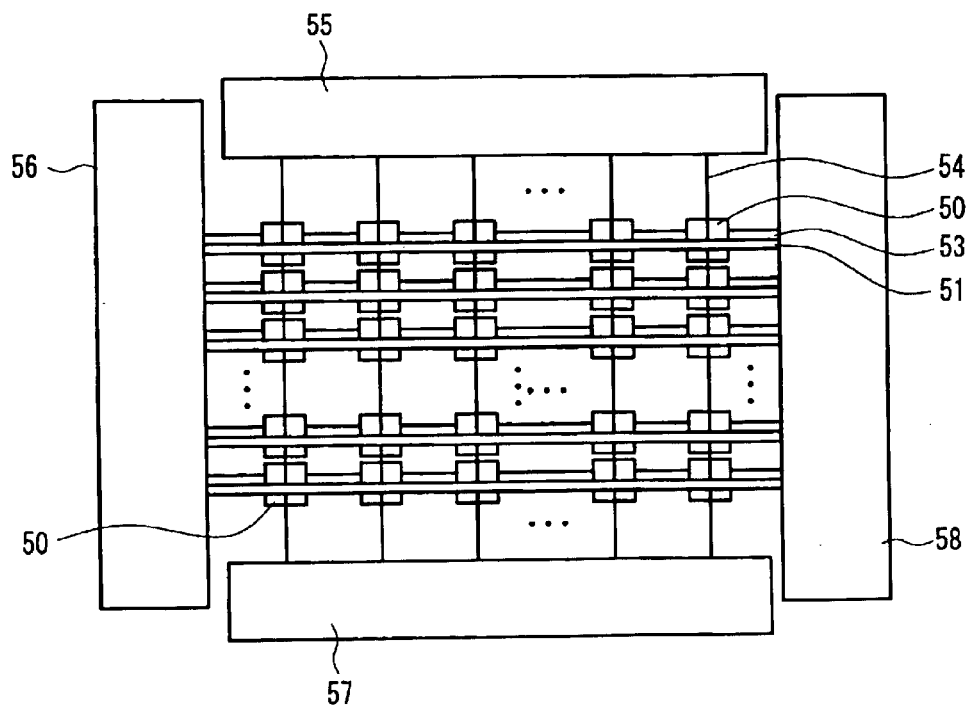
FIG. 11 is a plan view showing an example of a MRAM of the present invention.

As shown in FIG. 11, a MRAM includes a plurality of magnetoresistive elements that are arranged, e.g., in a matrix. In this MRAM, sense lines 54 extend along the columns of MR elements 50, and word lines 51 and bit lines 53 extend along the rows perpendicular to the columns. Decoding function portions 55, 56 and data exchange portions 57, 58 that surround a group of elements are used to record/read information on the elements arranged in a predetermined number of rows and columns.

Figure 12:
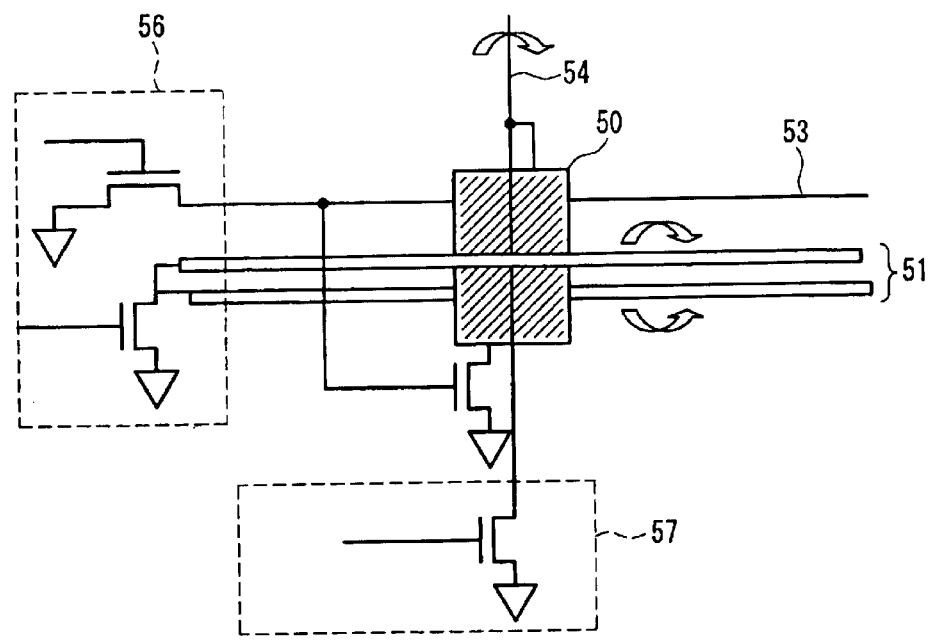
FIG. 12 is a partially enlarged view of FIG. 11, showing a region around a MR element together with a magnetic field to be generated.

As shown in FIG. 12, the word line 51 actually includes a plurality of impedance-matched wires that extend in the same direction. These lines 51 are coupled together preferably in an odd mode and used with the sense line 54 to apply a synthetic magnetic field to the MR element 50, which is placed between the wires.

As described above, the present invention encompasses even a magnetoresistive memory device that includes a plurality of MR elements arranged so as to form a matrix in a predetermined plane, and a wiring for applying a magnetic field to the magnetoresistive elements, wherein the MR elements constitute a plurality of columns, the wiring includes two or more conductive wires for each of the columns, and the two or more conductive wires extend along the columns. It is preferable that the two or more conductive wires include a pair of conductive wires 51 that sandwich the predetermined plane. The two or more conductive wires may include only a plurality of conductive wires that are spaced away from the MR element 50, as shown in FIG. 12.

Figure 13:
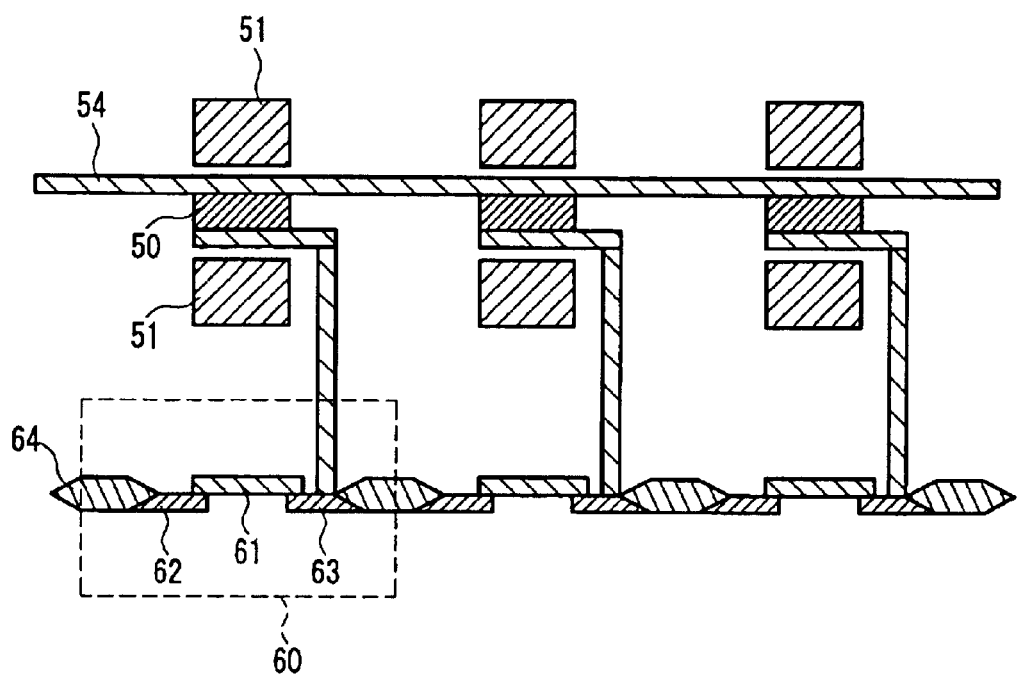
FIG. 13 is a cross-sectional view showing an example of the connection between a MOS transistor and a MR element.
Figure 14:
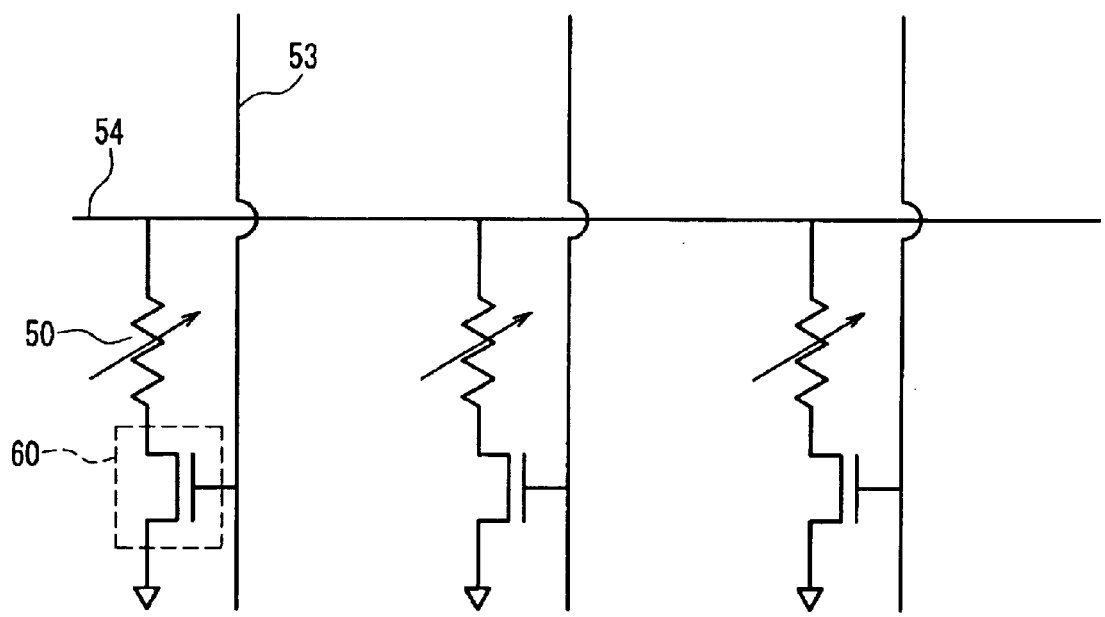
FIG. 14 is a wiring diagram partially showing a MRAM that uses the arrangement in FIG. 13.
Figure 15:
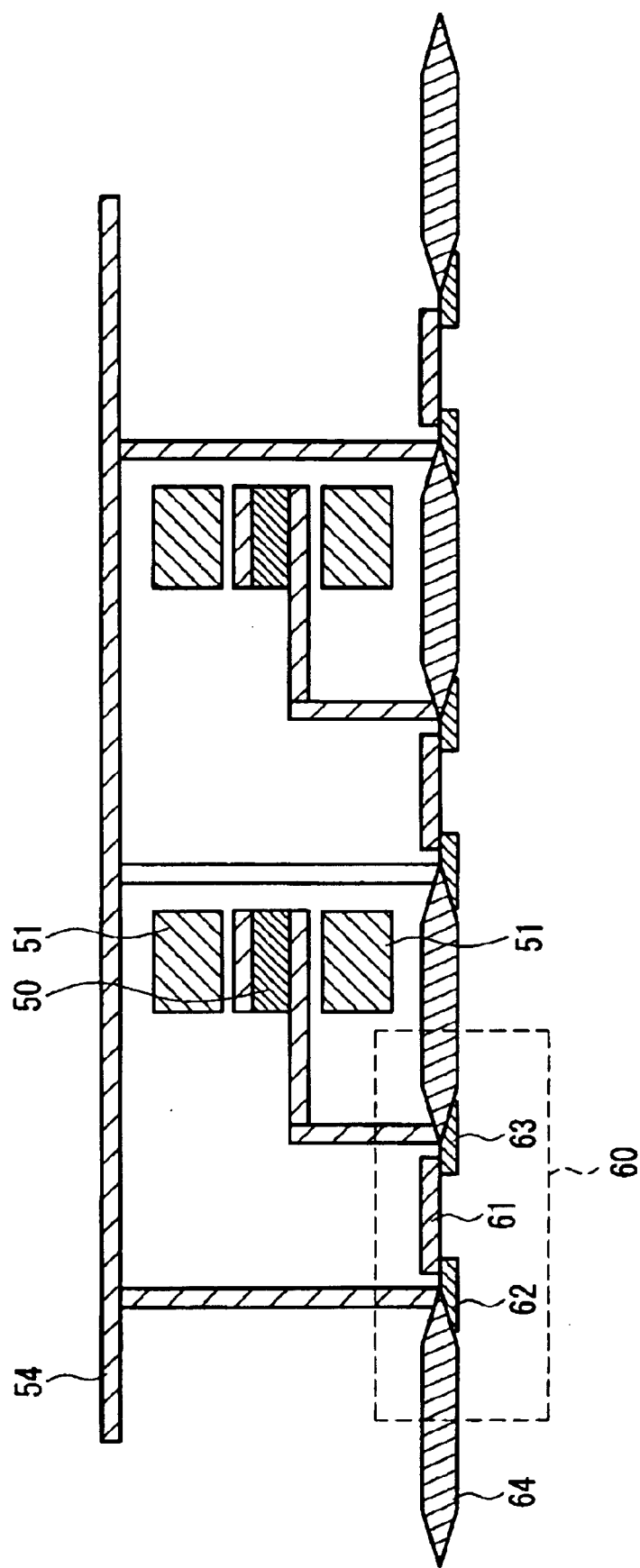
FIG. 15 is a cross-sectional view showing another example of the connection between a MOS transistor and a MR element.
Figure 16:
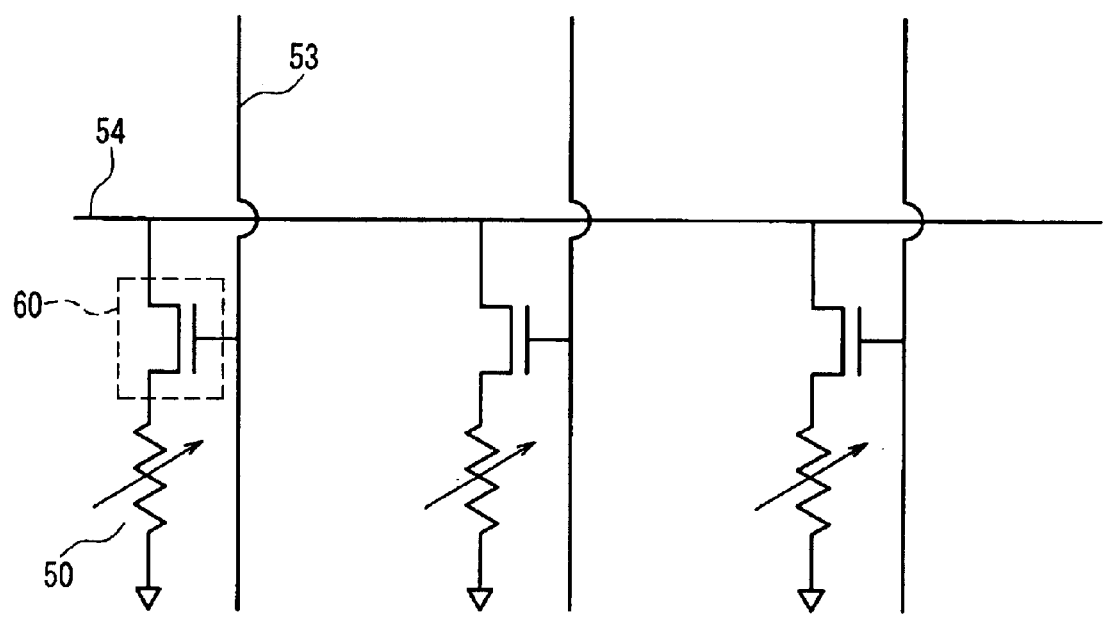
FIG. 16 is a wiring diagram partially showing a MRAM that uses the arrangement in FIG. 15.

The following is an example of the specific configuration of a MR element in combination with a MOS transistor. As shown in FIG. 13, a MR element 50 is connected to a MOS transistor 60 that includes a gate 61, a source 62, and a drain 63, thus forming a memory cell. The MOS transistors are separated from each other by a thermal oxide film 64. FIG. 14 shows an equivalent circuit of a group of elements in FIG. 13. FIG. 16 shows a preferred circuit to protect the elements from electrostatic damage. In this circuit, the MR element 50 is connected to a sense line 54 via the MOS transistor 60. The circuit can be achieved, e.g., by forming a MRAM as shown in FIG. 15.

Figures 17A, 17B, 17C, 17D, 17E, 17F:
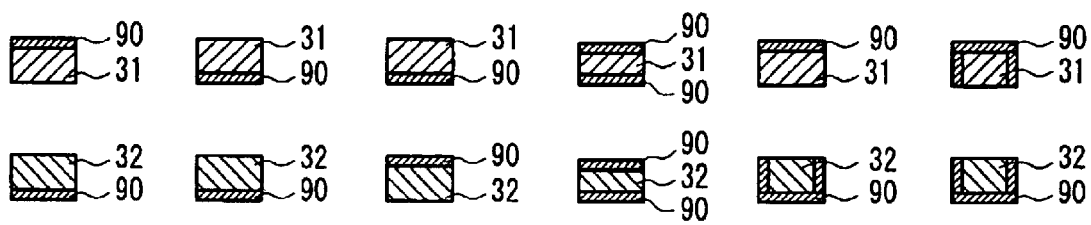
FIGS. 17A to 17F are cross-sectional views, each showing an example of a pair of signal lines of FIG. 8B provided with a ferromagnetic member.

A ferromagnetic member may be arranged around a conductive wire to apply a magnetic field efficiently to a MR element. When the ferromagnetic member is placed on the side of the non-magnetic conductive wire that faces the MR element, the magnetic field can be applied efficiently to the MR element. When the ferromagnetic member is placed on the side of the non-magnetic conductive wire that faces away from the MR element, a leakage magnetic field can be suppressed. To suppress crosstalk, the ferromagnetic member may be placed between the adjacent MR elements or between a MR element and the conductive wires that apply a magnetic field to the MR element. It is preferable that the ferromagnetic member is in contact with the conductive wires that constitute a pulse transmission line. FIGS. 17A to 17F show examples of the ferromagnetic member added to the configuration in FIG. 8B. A ferromagnetic member 90 in FIG. 17C is useful for the efficient application of a magnetic field to a MR element (not shown) between conductive wires 31, 32. A ferromagnetic member 90 in each of FIGS. 17A, 17E, and 17F is useful for the suppression of crosstalk. As shown in FIGS. 17B and 17D, a ferromagnetic member 90 may be arranged so that both the effects as described above can be obtained together.

Figure 18:
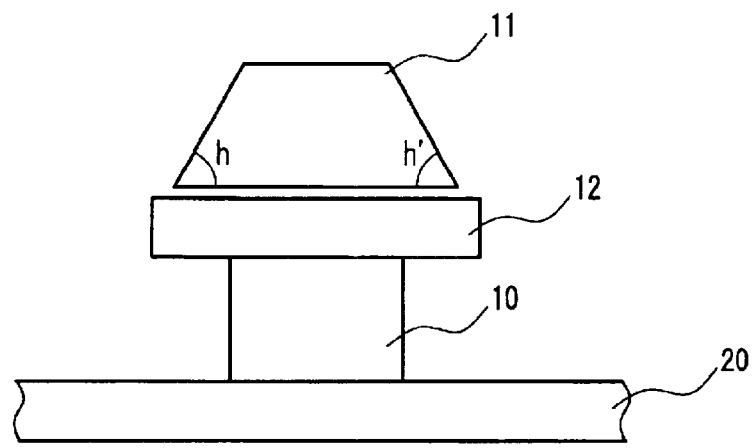
FIG. 18 is a cross-sectional view showing an example of a conductive wire whose cross section can have any shape other than a rectangle.

To apply a magnetic field efficiently, at least one of the plurality of conductive wires may have a cross section whose width is progressively larger as it gets closer to the MR element. For example, as shown in FIG. 18, when the cross section of the conductive wire 11 (FIG. 1) is shaped into a trapezoid so that the base of the trapezoid orients toward the MR element 10 and each of the base angles h, h' is less than 90°, the efficient application of a pulse magnetic field can be achieved.

Figure 19A:
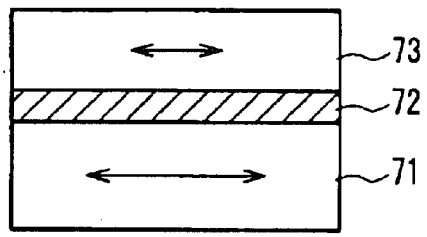
FIGS. 19A to 19G are cross-sectional views, each showing an example of the film configuration of a MR element of the present invention.
Figure 19E:
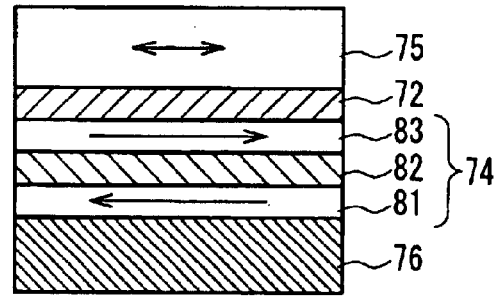
Figure 19B:
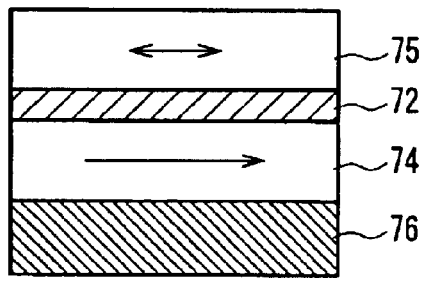
Figure 19F:
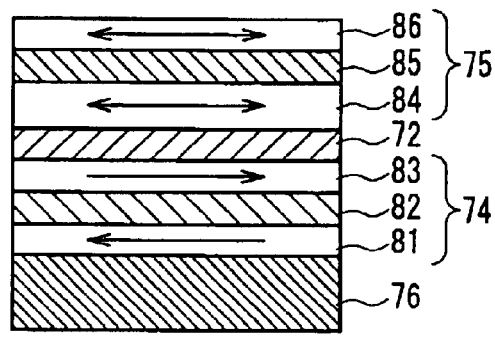
Figure 19C:
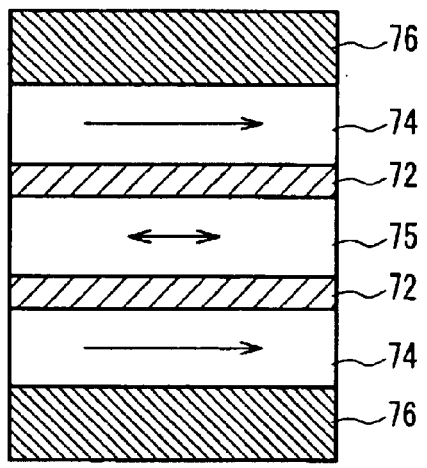
Figure 19G:
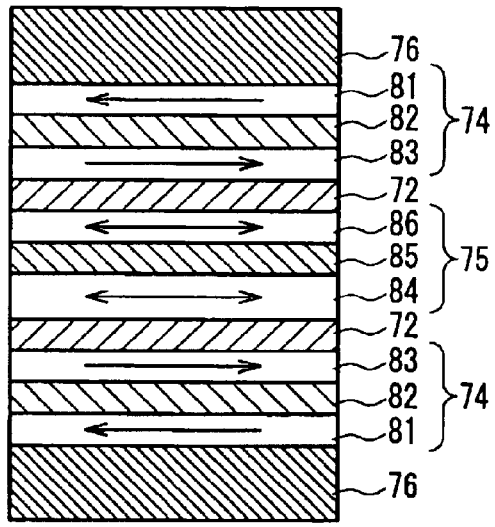
Figure 19D:
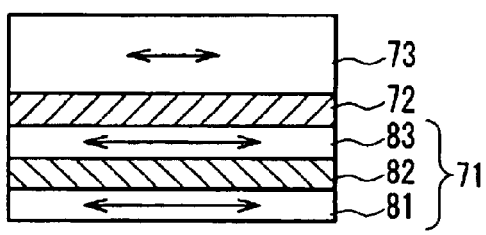
Figure 20A:
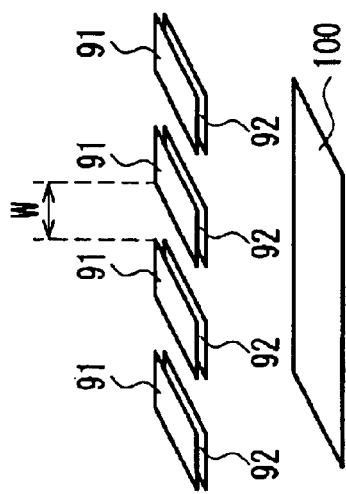
FIGS. 20A to 20F are simplified perspective views, each showing the arrangement of word lines of a MRAM produced in Example 2.
Figure 20B:
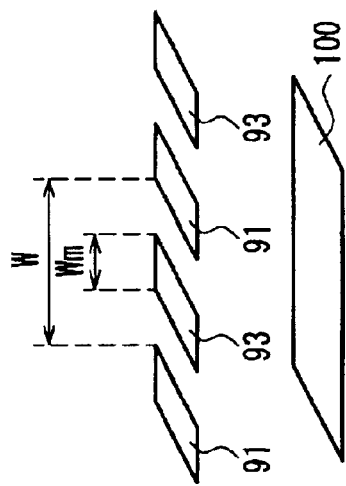
Figure 20C:
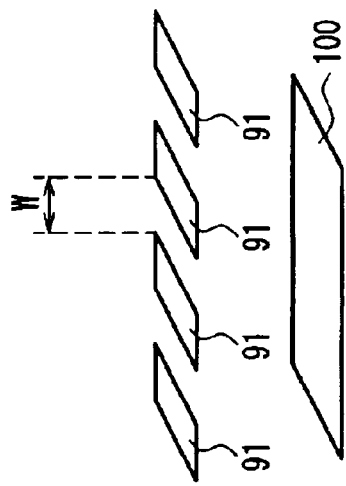
Figure 20D:
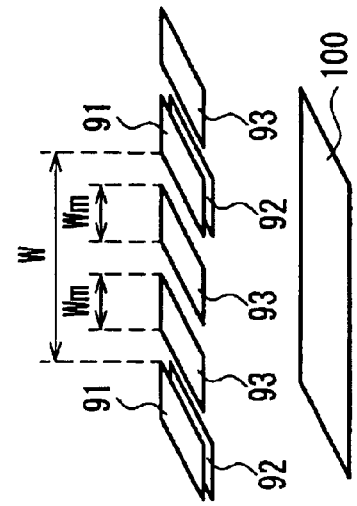
Figure 20E:
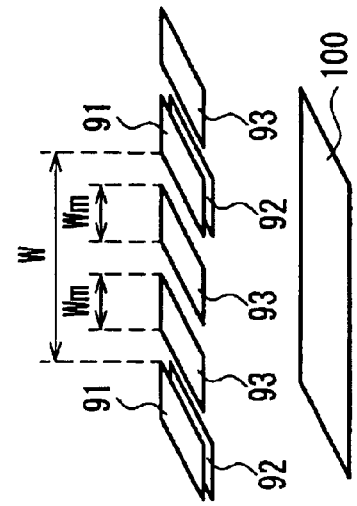
Figure 20F:
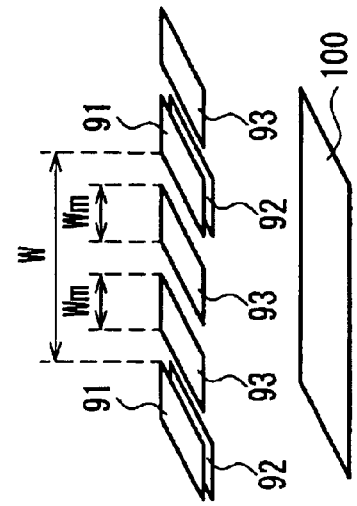

As a MR element of a MRAM, a conventional element can be used without any limitation. FIGS. 19A to 19G show examples of the configuration of a MR element. In FIG. 19A, magnetic layers 71, 73 may be stacked via an intermediate layer 72, where the magnetic layer 71 is relatively hard to cause magnetization reversal, while the magnetic layer 73 is relatively easy to cause magnetization reversal. In FIG. 19B, an antiferromagnetic layer 76 may be used to pin the magnetization of a magnetic layer (a pinned layer) 74, thereby forming a spin-valve type element. In FIG. 19C, a pinned layer 74 may be placed on both sides of a free layer 75. In FIG. 19D, a laminated ferrimagnetic material including a pair of magnetic films 81, 83 that are exchange-coupled antiferromagnetically via an intermediate film 82 may be used as a layer 71 with a relatively high coercive force. In FIG. 19E, the laminated ferrimagnetic material also may be used as a pinned layer. In FIG. 19F, a laminated ferrimagnetic material including a pair of magnetic films 84, 86 that are exchange-coupled antiferromagnetically via an intermediate film 85 may be used as a free layer 75. In FIG. 19G, a laminated ferrimagnetic pinned layer 74 and a laminated ferrimagnetic free layer 75 may be used to form a double-coupled element.

The resistance of the above MR elements changes with the magnetization rotation of the magnetic layers 73, 75. The MR elements can be either TMR elements or CPP-GMR elements (CPP stands for current perpendicular to the plane). The preferred thickness of each magnetic layer is 1 nm to 10 nm.

A magnetic material for the MR elements is not particularly limited. For example, Co, CoFe, NiFe or NiFeCo can be used as a "(semi) hard" magnetic material suitable for the magnetic layer 71 having a high coercive force and the pinned layer 74. Co or CoFe is suitable particularly for the achievement of a large MR ratio. Therefore, it is preferable to use Co or CoFe for at least the magnetic layer in contact with the non-magnetic layer. The preferred composition of CoFe can be given by $Co_y Fe_z$ ($0.2 \leq y \leq 0.95$ and $0 \leq z \leq 0.5$).

XMnSb (X represents a metallic element, preferably at least one selected from Ni, Pt, Pd and Cu) can provide a large MR ratio because of its high magnetic polarizability.

$MFe_2O_4$ (M is at least one element selected from Fe, Co and Ni), which is an oxide magnetic material, also is preferred. The oxide magnetic material can exhibit ferromagnetism at relatively high temperatures, and the resistance of a Co- or Ni-rich material is extremely higher than that of a Fe-rich material. The Co-rich material has a large magnetic anisotropy. The desired characteristics can be obtained by appropriately adjusting the composition ratio.

In general, a NiCoFe alloy can be used as a "soft" magnetic film suitable for the free layer 75 or the like. When the composition of the NiCoFe film is expressed by $Ni_x Co_y Fe_z$, a Ni-rich film with $0.6 \leq x \leq 0.9$, $0 \leq y \leq 0.4$, and $0 \leq z \leq 0.3$ is suitable. When the composition is expressed by $Ni_{x'} Co_{y'} Fe_{z'}$, a Co-rich film with $0 \leq x' \leq 0.4$, $0.2 \leq y' \leq 0.95$, and $0 \leq z' \leq 0.5$ is suitable.

Examples of a material suitable for the anti-ferromagnetic layer 76 include a disordered alloy such as IrMn, RhMn, RuMn and CrPtMn. When these materials are deposited in a magnetic field, they can be exchange-coupled readily to the magnetic film. An ordered alloy, such as NiMn and Pt(Pd)Mn, has excellent thermal stability, though it requires heat treatment for ordering. PtMn is preferred to the other two materials. An oxide anti-ferromagnetic material, e.g., $\alpha\text{-}Fe_2O_3$, NiO or $LTO_3$ also may be used, where L is at least one selected from rare-earth elements other than Ce, and T is at least one selected from Fe, Cr, Mn and Co. For the oxide having a high electrical resistivity, an electrode is needed to make a direct contact with the magnetic layer so as to prevent the effect of such a high resistivity on the electrical characteristics.

A material for the word lines, the sense lines, and the bit lines is not particularly limited, and, e.g., Al, Cu, Pt or Au can be used.

EXAMPLES

Example 1

Using a multi-target sputtering apparatus, a MR element with the multi-layer structure shown in FIG. 19F was produced. This MR element has the following film configuration:

$Ni_{0.81}Fe_{0.19}(2)/Ru(0.7)/Ni_{0.81}Fe_{0.19}(3)/Al_2O_3(1.2)/Cu_{0.75}Fe_{0.25}(2)/Ru(0.7)/CO_{0.75}Fe_{0.25}(2)/PtMn(20)$.

Here, the films are arranged in the order mentioned from the top to the bottom of the element, and the figures in parentheses denote the film thickness (nm).

This example uses two types of $Al_2O_3$ layer, each of which serves as a tunnel insulating layer. The type A was prepared by forming an Al film with sputtering and oxidizing the Al film. The type B was prepared by depositing $Al_2O_3$ itself with sputtering. The type A was oxidized in any one of the following manners: natural oxidation in a vacuum vessel, natural oxidation in a vacuum vessel with increased temperature, and oxygen-containing plasma oxidation in a vacuum vessel. In either case, a non-magnetic insulating film capable of functioning as a tunnel barrier was formed. The type B also provided a non-magnetic insulating film capable of functioning as a good tunnel barrier. The thickness of each film was controlled with a shutter. Both types had an element area (junction area) of $0.12\ \mu m^2$.

The MR characteristics of the single MR element thus produced were measured under the conditions of room temperature, an applied magnetic field of 100 Oe (approximately 7.96 kA/m), and a bias voltage of 100 mV. The results showed that the MR ratio was about 30%, and the magnetoresistance occurred when the width of the magnetic field was 10 Oe.

Using this MR element, a MRAM having the configuration shown in FIGS. 11 and 12 was produced. The MRAM included a silicon substrate, on which a MOS transistor was formed for each MR element beforehand by a semiconductor process. A silicon oxide was used as an interlayer insulating film between the transistor and the MR element, and an aluminum oxide was used to insulate the MR element from the word line.

The sense lines, the bit lines, and the word lines were made of copper. The space between a pair of conductive wires, which served as a word line, was $0.35\ \mu m$. Each of the conductive wires had a width of about $0.5\ \mu m$ and a thickness of about $0.5\ \mu m$. The space of the conductive wires between adjacent columns of the MR elements was about $0.6\ \mu m$. The terminal resistance was connected to either end of the wiring, and the characteristic impedance of the word line was adjusted to about 75 Ω. One of the conductive wires was used as a passive line having a ground potential, and the other was used as a signal line.

This MRAM was able to record/read information of 16 bits per word.

The transmission of a pulse signal to the word line was examined in detail by using the MRAM. A pulse current was input to the signal line so that the time required for the pulse to rise from 1V to 5V was 1 ns, and the transmission time (the length of the wiring was about 10 cm) was 0.5 ns. Consequently, it took the signal 1 ns to rise. Compared with a word line of a single wire, the signal was not reflected significantly at the near end and the far end of the word line when viewed from the pulse sending side.

Under the above input conditions, the effect of crosstalk caused between the wires was examined. The examination was carried out by using a MRAM in which the space between adjacent conductive wires was about $0.6\ \mu m$. Compared with a word line of a single wire, a large signal was not generated at the near end and the far end of the adjacent conductive wires when viewed from the pulse sending side.

In this arrangement, an even-mode coupling was made by changing the distance between the adjacent conductive wires. Moreover, an odd-mode coupling also was made by adjusting the value of the terminal resistance.

Example 2

MRAMs that differ in the arrangement of word lines as shown in FIGS. 20A to 20F were produced in the same manner as Example 1. The word line included a signal line 91 and passive lines 92, 93. The passive line 92 and the signal line 91 sandwiched a MR element (not shown), and the passive line 93 and the signal line 91 were formed in the same plane. In FIGS. 20A to 20F, the signal line and the MR element have one-to-one correspondence.

Both the signal line 91 and the passive line 92 had a width of $0.2\ \mu m$. In each of the MRAMs, the distance between a lower ground plane 100 and the closest conductive wires 91 to 93 was $100\ \mu m$, and the distance between an upper ground plane (not shown) and the signal line 91 was $100\ \mu m$.

A population of 1000 samples for each of the MRAMs was evaluated based on the malfunction of unselected memories that were adjacent to the word line through which signals constituting one word were sent. Table 1 shows the results. In Table 1, d represents a space between the signal line 91 and the passive line 92, w represents a space between the adjacent signal lines 91, 91, and Wm represents a width of the passive line 93.

TABLE 1

| Sample | w | Wm | d | Degree of malfunction (%) |
|---|---|---|---|---|
| Type I (FIG. 20A) | | | | |
| 1 | 0.2 | | | 83 |
| 2 | 0.4 | | | 15 |
| 3 | 0.8 | | | 9 |
| Type II (FIG. 20B) | | | | |
| 1 | 0.4 | 0.2 | | 10 |
| 2 | 0.6 | 0.2 | | 7 |
| 3 | 0.8 | 0.2 | | 4 |
| Type III (FIG. 20C) | | | | |
| 1 | 0.2 | | 0.2 | 10 |
| 2 | 0.4 | | 0.2 | 2 |
| 3 | 0.8 | | 0.2 | <1 |
| Type IV (FIG. 20D) | | | | |
| 1 | 0.4 | 0.2 | 0.2 | 1 |
| 2 | 0.6 | 0.2 | 0.2 | <1 |
| 3 | 0.8 | 0.2 | 0.2 | <1 |
| Type V (FIG. 20E) | | | | |
| 1 | 0.4 | 0.2 | 0.2 | 1 |
| 2 | 0.5 | 0.3 | 0.2 | <1 |
| 3 | 0.6 | 0.4 | 0.2 | <1 |
| Type VI (FIG. 20F) | | | | |
| 1 | 0.7 | 0.2 | 0.2 | <1 |
| 2 | 1.0 | 0.2 | 0.2 | <1 |
| 3 | 1.3 | 0.2 | 0.2 | <1 |

Example 3

Figure 8D:
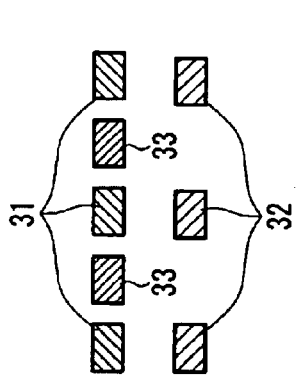
Figure 8E:
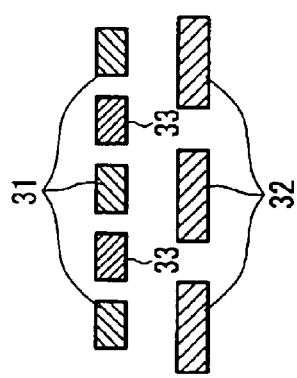
Figure 8F:
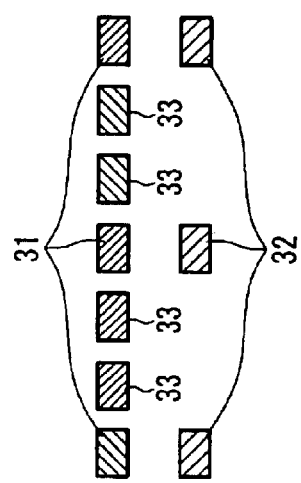

A MRAM was produced in the same manner as Example 1. In this example, the MRAM included a conductive wire 33 between adjacent MR elements other than a pair of conductive wires 31, 32, as shown in FIG. 8D.

The transmission of a pulse signal to the word lines 31 to 33 was evaluated with the MRAM. Each of the word lines had a width of about $0.5\ \mu m$ and a thickness of about $0.3\ \mu m$, and the distance between the adjacent word lines was about $0.3\ \mu m$. The terminal resistance was connected to either end of the wiring, and the characteristic impedance was adjusted to about 75 Ω.

Under the input conditions that the time required for the applied pulse to rise from 1V to 5V was 1 ns and the transmission time (the length of the wiring was about 10 cm) was 0.5 ns, it took the signal 1 ns to rise. Compared with a single word line, the signal was not reflected significantly at the near end and the far end of the word lines when viewed from the pulse sending side.

Next, the effect of crosstalk caused between the adjacent wires was evaluated under the above input conditions. Here, the distance between the adjacent conductive wires was about 0.35 μm, and the space between the signal lines 31, 31 was about 1.2 μm. Compared with a single word line, a large signal was not generated at the near end and the far end of the adjacent conductive wires when viewed from the pulse sending side. The wiring in FIG. 8D suppressed the generation of a large signal at the near end and the far end of the adjacent wires, even as compared with the configuration in FIG. 8C.

In this wiring, an even-mode coupling was made when the distance between the adjacent conductive wires was about 0.1 μm to 1 μm. Moreover, an odd-mode coupling was made when the value of the terminal resistance was adjusted in the range of 10 Ω to 100 kΩ.

What is claimed is:

1. A magnetoresistive memory device comprising:
    a magnetoresistive element; and
    a wiring for applying a magnetic field to the magnetoresistive element,
    wherein the wiring comprises two or more conductive wires that extend in a same direction, and the two or more conductive wires comprise a signal line for introducing a current that applies the magnetic field and a passive line maintained at a predetermined electric potential.

2. The magnetoresistive memory device according to claim 1, wherein characteristic impedance of the two or more conductive wires is 5 kΩ or less.

3. The magnetoresistive memory device according to claim 1, wherein the two or more conductive wires comprise a pair of conductive wires that sandwich the magnetoresistive element.

4. The magnetoresistive memory device according to claim 3, wherein the pair of conductive wires are coupled in an odd mode.

5. The magnetoresistive memory device according to claim 1, further comprising:
    a second magnetoresistive element, where said magnetoresistive element is identified as a first magnetoresistive element; and
    a first signal line and a second signal line for introducing a current that applies the magnetic field to the first magnetoresistive element and the second magnetoresistive element, respectively,
    wherein the first signal line and the second signal line extend in a same direction, and at least one passive line having a predetermined electric potential is provided between the first signal line and the second signal line.

6. The magnetoresistive memory device according to claim 5, wherein at least one of the first signal line and the second signal line is coupled to the passive line in an even mode.

7. The magnetoresistive memory device according to claim 1, wherein the first signal line, the second signal line, and the passive line are arranged in a same plane.

8. The magnetoresistive memory device according to claim 5, further comprising a second passive line, where said passive line is identified as a first passive line,
    wherein the second passive line is arranged so that the first magnetoresistive element or the second magnetoresistive element is provided between the second passive line and the signal line that applies a magnetic field to the corresponding magnetoresistive element.

9. The magnetoresistive memory device according to claim 8, wherein the second passive line and said signal line that sandwiches the first magnetoresistive element or the second magnetoresistive element with the second passive line are coupled in an odd mode.

10. A magnetoresistive memory device comprising:
    a plurality of magnetoresistive elements arranged so as to form a matrix in a predetermined plane; and
    a wiring for applying a magnetic field to the magnetoresistive elements,
    wherein the magnetoresistive elements constitute a plurality of columns, the wiring comprises two or more conductive wires for each of the columns, and the two or more conductive wires extend along the columns and comprise a signal line for introducing a current that applies the magnetic field and a passive line maintained at a predetermined electric potential.

11. The magnetoresistive memory device according to claim 10, wherein the two or more conductive wires comprise a pair of conductive wires that are opposite to each other via the predetermined plane.

12. The magnetoresistive memory device according to claim 10, wherein the wiring further comprises conductive wires that are arranged perpendicular to the columns.

* * * * *

UNITED STATES PATENT AND TRADEMARK OFFICE
CERTIFICATE OF CORRECTION

PATENT NO. : 6,778,427 B2
DATED : August 17, 2004
INVENTOR(S) : Odagawa et al.

It is certified that error appears in the above-identified patent and that said Letters Patent is hereby corrected as shown below:

Column 12,
Line 13, "according to claim 1" should read -- according to claim 5 --.

Signed and Sealed this

Twenty-seventh Day of December, 2005

JON W. DUDAS
*Director of the United States Patent and Trademark Office*